United States Patent
Heyne

(10) Patent No.: US 6,191,627 B1
(45) Date of Patent: Feb. 20, 2001

(54) INTEGRATED CIRCUIT HAVING ADJUSTABLE DELAY UNITS FOR CLOCK SIGNALS

(75) Inventor: Patrick Heyne, München (DE)

(73) Assignee: Siemens Aktiengesellschaft, Munich (DE)

( * ) Notice: Under 35 U.S.C. 154(b), the term of this patent shall be extended for 0 days.

(21) Appl. No.: 09/408,685

(22) Filed: Sep. 30, 1999

(30) Foreign Application Priority Data

Sep. 30, 1998 (DE) .............................................. 198 45 121

(51) Int. Cl.[7] ...................................................... H03L 7/00
(52) U.S. Cl. .......................... 327/161; 327/244; 327/293
(58) Field of Search .................................. 327/2, 3, 158, 327/161, 236, 244, 291, 292, 293, 294, 295, 296, 297, 298, 299

(56) References Cited

U.S. PATENT DOCUMENTS

| | | | |
|---|---|---|---|
| 5,675,274 | * 10/1997 | Kobayashi et al. | 327/158 |
| 5,684,421 | 11/1997 | Chapman et al. | 327/261 |
| 5,973,526 | * 10/1999 | Dabral | 327/170 |
| 6,005,426 | * 12/1999 | Lin et al. | 327/158 |
| 6,037,812 | * 3/2000 | Gaudet | 327/116 |
| 6,043,694 | * 3/2000 | Dortu | 327/156 |
| 6,069,506 | * 5/2000 | Miller, Jr. et al. | 327/156 |
| 6,081,142 | * 6/2000 | Douchi et al. | 327/158 |
| 6,087,857 | * 8/2000 | Wang | 327/5 |
| 6,100,733 | * 8/2000 | Dortu et al. | 327/149 |

FOREIGN PATENT DOCUMENTS

| | | |
|---|---|---|
| 1148591 | 5/1963 | (DE) . |
| 2135565 | 2/1972 | (DE) . |
| 19703986A1 | 12/1997 | (DE) . |

* cited by examiner

Primary Examiner—Jeffrey Zweizig
(74) Attorney, Agent, or Firm—Herbert L. Lerner; Laurence A. Greenberg; Werner H. Stemer

(57) ABSTRACT

An integrated circuit includes a first adjustable delay unit to which a first clock signal is fed and a second adjustable delay unit to which a second clock signal is fed. A phase detector is connected to the input and to the output of the first delay unit. A control unit serves for correcting a phase difference obtained by the phase detector and controls the delay time of the first delay unit in a corresponding manner. The control unit additionally sets the delay time of the second delay unit to essentially the same value as that of the first delay unit. Furthermore, the output of the second delay unit is connected to the input of a third adjustable delay unit.

7 Claims, 2 Drawing Sheets

INTEGRATED CIRCUIT HAVING ADJUSTABLE DELAY UNITS FOR CLOCK SIGNALS

BACKGROUND OF THE INVENTION

Field of the Invention

The invention relates to an integrated circuit having adjustable delay units for clock signals.

U.S. Pat. No. 5,684,421 describes a delay locked loop (DLL) which generates a time-delayed output clock signal from an input clock signal. The output clock signal has a specific phase relationship with respect to the input clock signal. An adjustable delay unit is disposed between the input and the output of the DLL. The input and the output are additionally connected to a phase detector which controls the delay time of the delay unit as a function of the phase difference that is ascertained. It is also mentioned that a further adjustable delay unit can be provided in each case between the output of the DLL and/or the input of the DLL and the phase detector. Those further adjustable delay units serve for setting the phase angle of the output clock signal with respect to the input clock signal. The phase detector always determines the phase difference between the clock signals that are fed directly to it.

U.S. Pat. No. 5,684,421 also discloses a DLL having an input clock signal which is a differential clock signal that is fed to the delay unit through a line pair. The signals on both lines of the line pair are delayed uniformly by the delay unit. Consequently, the signals on both lines of the data line pair are delayed by the same delay time and fed to circuit components connected downstream of the DLL.

SUMMARY OF THE INVENTION

It is accordingly an object of the invention to provide an integrated circuit having adjustable delay units for clock signals, which overcomes the hereinafore-mentioned disadvantages of the heretofore-known devices of this general type, in which two input clock signals are delayed, with the result that output clock signals being generated have a specific phase difference relative to a respective input clock signal, which is realized with little outlay and in which the output clock signals may each have different delays with respect to their input clock signals.

With the foregoing and other objects in view there is provided, in accordance with the invention, an integrated circuit, comprising a first delay unit having an adjustable delay time, an input for feeding in a first clock signal and an output; a second delay unit having an adjustable delay time, an input for feeding in a second clock signal and an output; a phase detector having a first input connected to the input of the first delay unit and a second input connected to the output of the first delay unit; a control unit controlling the delay time of the first delay unit for correcting, or controlling a deviation of, a phase difference ascertained by the phase detector and setting the delay time of the second delay unit to substantially the same value as that of the first delay unit; a circuit unit having a first input connected to the output of the first delay unit and a second input connected to the output of the second delay unit; and a third delay unit having an adjustable delay time, the third delay unit connected between the output of the second delay unit and the second input of the circuit unit.

In the case of the invention, the setting of the delay time of the first and second delay units is effected by the control unit as a function of the phase difference ascertained by the phase detector. The first delay unit is part of a control loop which is closed by the phase detector and the control unit. On the other hand, the delay time of the second delay unit is set only by the control unit to the same value as that of the first delay unit. Consequently, the output clock signal at the output of the second delay unit has the same time delay with respect to the input clock signal of the second delay unit as the output clock signal at the output of the first delay unit has with respect to the input clock signal of the first delay unit. However, according to the invention, the output clock signal of the second delay unit is not fed directly to the circuit unit to be controlled, but rather through the third delay unit. Since the delay time of the third delay unit is also adjustable, it is possible, through the latter, to set a desired phase angle of the output clock signal (fed to the circuit unit) of the second delay unit, independently of the delay time of the first delay unit.

In accordance with another feature of the invention, the second clock signal is the inverse of the first clock signal.

In accordance with a further feature of the invention, there is provided a fourth delay unit having an adjustable delay time, the fourth delay unit connected between the output of the first delay unit and both the second input of the phase detector and the first input of the circuit unit.

In accordance with an added feature of the invention, there is provided another or fifth delay unit having an adjustable delay time, the other or fifth delay unit connected between the second input of the phase detector and both the output of the first delay unit and the first input of the circuit unit.

In accordance with an additional feature of the invention, there is provided a further or sixth delay unit having an adjustable delay time, the further or sixth delay unit connected between the input of the first delay unit and the first input of the phase detector.

In accordance with yet another feature of the invention, signals with positive edges are present at the first and second inputs of the circuit unit, and the circuit unit has an output supplying an output clock signal having one edge type phase-locked with respect to the positive edges of the signal at the first input of the circuit unit and a second edge type phase-locked with respect to the positive edges of the signal at the second input of the circuit unit.

In accordance with a concomitant feature of the invention, the circuit unit is connected between the output of the first delay unit and the second input of the phase detector.

Other features which are considered as characteristic for the invention are set forth in the appended claims.

Although the invention is illustrated and described herein as embodied in an integrated circuit having adjustable delay units for clock signals, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. is a schematic circuit diagram of an exemplary embodiment of an input circuit of FIG. 3.

DESCRIPTION OF THE PREFERRED EMBODIMENTS

Figure 1:
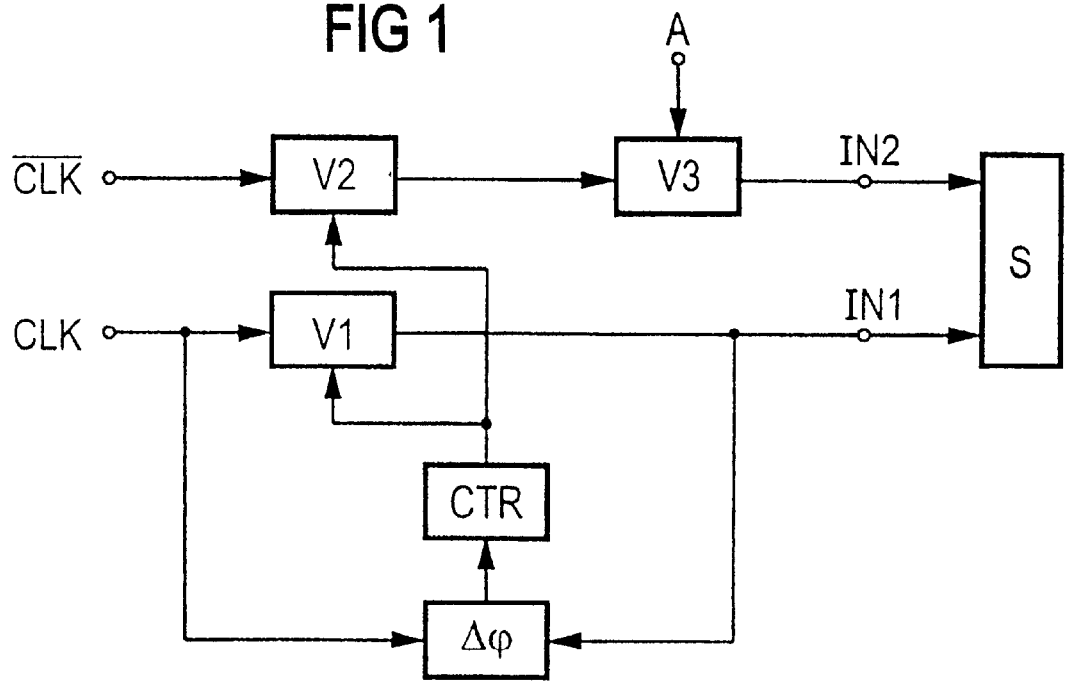
FIG. 1 is a block circuit diagram of a first exemplary embodiment,of the integrated circuit.

Referring now to the figures of the drawings in detail and first, particularly, to FIG. 1 thereof, there are seen components of an integrated circuit which are essential for understanding the invention. The integrated circuit has a circuit unit S having a first input IN1 and a second input IN2. Clock signals which serve to drive the circuit unit S are fed to the circuit unit at the inputs IN1, IN2. These clock signals are derived from first and second input clock signals CLK, $\overline{\text{CLK}}$ and have a desired phase angle with respect to the input clock signals.

In order to obtain the desired phase angle, the first input clock signal CLK is connected to the first input IN1 of the circuit unit S through a first adjustable delay unit V1. An input and an output of the first delay unit V1 are respectively connected to a first and a second input of a phase detector $\Delta\phi$, which detects a phase difference that may be present between an output clock signal of the first delay unit V1 and the first input clock signal CLK. An output of the phase detector $\Delta\phi$ is connected to an input of a control unit CTR. The control unit CTR has an output which is connected to a control input of the first delay unit V1. The control unit CTR sets a delay time of the first delay unit V1 on the basis of a phase difference determined by the phase detector $\Delta\phi$ in such a way that the phase difference becomes zero. The first delay unit V1, the phase detector $\Delta\phi$ and the control unit CTR form a control loop of a delay locked loop (DLL).

The second input clock signal $\overline{\text{CLK}}$ is connected to the second input IN2 of the circuit unit S through a second adjustable delay unit V2 and a third adjustable delay unit V3. The second delay unit V2 is constructed in exactly the same way as the first delay unit V1. Both may be constructed, for example, like the adjustable delay units described in U.S. Pat. No. 5,684,421. The output of the control unit CTR is also connected to a control input of the second delay unit V2. Therefore, the control unit CTR sets the delay time of the second delay unit V2 to the same value as that of the first delay unit V1.

In the present exemplary embodiment, the second input clock signal $\overline{\text{CLK}}$ is an inverted first input clock signal CLK. The invention is advantageously suitable for input clock signals which have a fixed phase relationship with respect to one another. However, it is not restricted thereto and is also suitable, therefore, for input clock signals which do not have a fixed phase relationship with respect to one another. In other exemplary embodiments of the invention, the second input clock signal can also correspond to the first input clock signal CLK.

Since the second input clock signal $\overline{\text{CLK}}$ is the inverse of the first input clock signal CLK and the delay times of the first delay unit V1 and of the second delay unit V2 are always set to the same value by the control unit CTR, in this exemplary embodiment the output clock signals of the first and second delay units likewise have the same phase relationship with respect to one another as the input clock signals CLK, $\overline{\text{CLK}}$. It may be desirable, however, for clock signals having a phase relationship which differs from the phase relationship of the input clock signals CLK, $\overline{\text{CLK}}$ to be fed to the inputs IN1, IN2 of the circuit unit S. In order to achieve this, the integrated circuit according to the invention is provided with the third delay unit V3 which has a delay time that can be set independently of the second delay unit V2. The setting of the delay time of the third delay unit V3 is effected through a control input A. This can be done, by way of example, from outside the integrated circuit or by setting a corresponding control signal through the use of programmable elements which are part of the integrated circuit. Electrical connections that can be interrupted through the use of a laser beam (laser fuses), for example, are suitable for this purpose.

The delay time of the third delay unit V3 may be selected between zero and a positive value through its control input A. Since the output of the first delay unit V1 and its input are connected directly to the phase detector $\Delta\phi$ in this exemplary embodiment, the DLL regulates the clock signal fed to the first input IN1 of the circuit unit S in such a way that it has the same phase angle as the first input clock signal CLK. Through the use of the adjustable third delay unit V3, it is then possible to determine whether the clock signal at the second input IN2 of the circuit unit S likewise has the same phase angle (delay time of the third delay unit V3=0) or a negative phase shift (delay time of the third delay unit V3>0), with respect to the second input clock signal $\overline{\text{CLK}}$.

Figure 2:
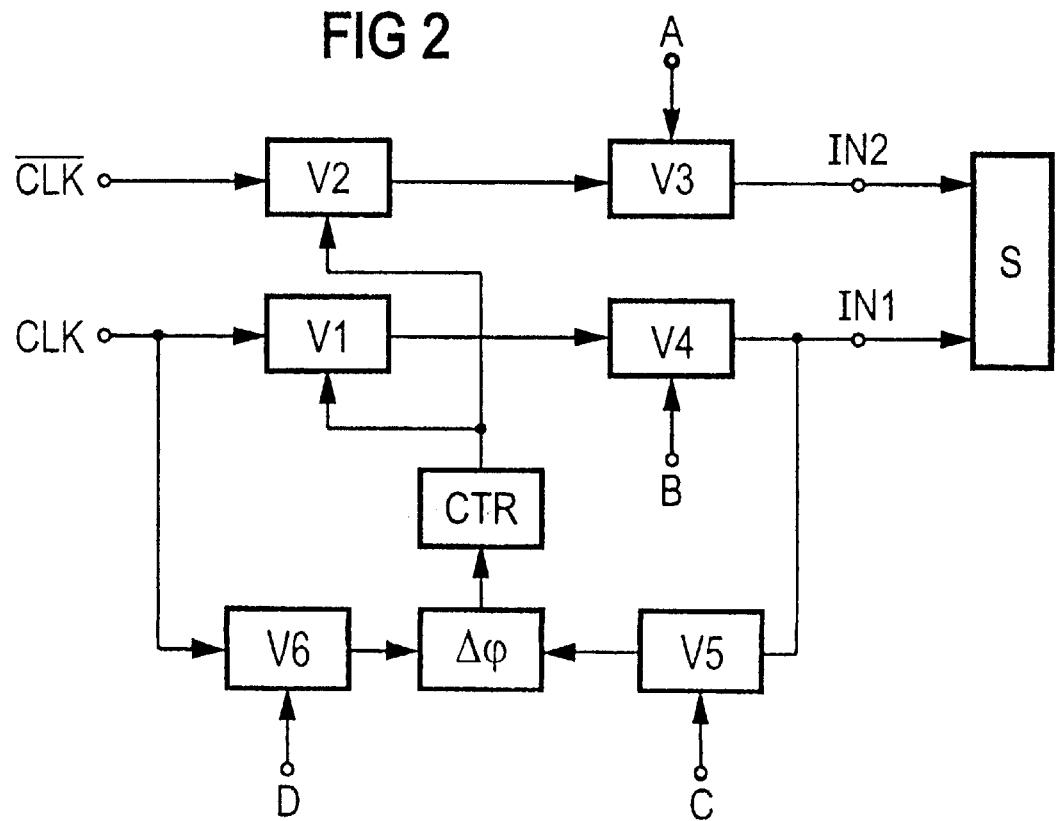
FIG. 2 is a block circuit diagram of a second exemplary embodiment.

FIG. 2 shows a second exemplary embodiment of the integrated circuit. The exemplary embodiment of FIG. 2 differs from the exemplary embodiment of FIG. 1 only with regard to additional components that are described below. The output of the first delay unit V1 is not connected directly to the first input IN1 of the circuit unit S but rather through an adjustable fourth delay unit V4. In addition, an output of the fourth delay unit V4 and the first input IN1 of the circuit unit S are connected to the phase detector $\Delta\phi$ through another or fifth delay unit V5 having an adjustable delay time. Furthermore, the input of the first delay unit V1 is not connected directly to the phase detector $\Delta\phi$ but rather through an adjustable further or sixth delay unit V6. The setting of the delay times of the fourth, fifth and sixth delay units V4, V5, V6 is effected through corresponding control inputs B, C, D, just like the above-described setting of the delay time of the third delay unit V3.

The additional delay units V4, V5, V6 serve to provide greater flexibility in the setting of the phase angle of the clock signals fed to the circuit unit S. If, by way of example, the delay time of the fifth delay unit V5 is set to a positive value, while the delay time of the sixth delay unit V6 is zero or assumes a smaller value, the phase of the clock signal at the first input IN1 of the circuit unit S leads the phase of the first input clock signal CLK if the phase detector $\Delta\phi$ no longer detects a phase difference. If, on the other hand, the delay time of the sixth delay unit V6 is greater than the delay time of the fifth delay unit V5, the phase of the clock signal at the input IN1 of the circuit unit S lags behind the phase of the first input clock signal CLK. This is due to the fact that the phase detector $\Delta\phi$ always ascertains the phase difference between the clock signals at its inputs.

Since the control unit CTR drives the second delay unit V2 in the same way as the first delay unit V1, the delay time of the fifth and sixth delay units V5, V6 also effects the phase angle of the clock signal at the second input IN2 of the circuit unit S.

The clock signal fed to the first input IN1 of the circuit unit S is delayed relative to the first input clock signal CLK by the sum of the delay times of the first delay unit V1 and the fourth delay unit V4. If the delay time of the fourth delay unit V4 is set to a positive value, a shorter delay time of the first delay unit V1 is produced due to the regulation carried out by the DLL. Consequently, the corresponding delay time of the second delay unit V2 is also shorter, with the result that altering the delay time of the fourth delay unit V4 also influences the phase angle of the clock signal at the second input IN2 of the circuit unit S.

It goes without saying that just one or two of the three additional delay units V4, V5, V6 illustrated in FIG. 2 may also be present in other exemplary embodiments of the invention.

Figure 3:
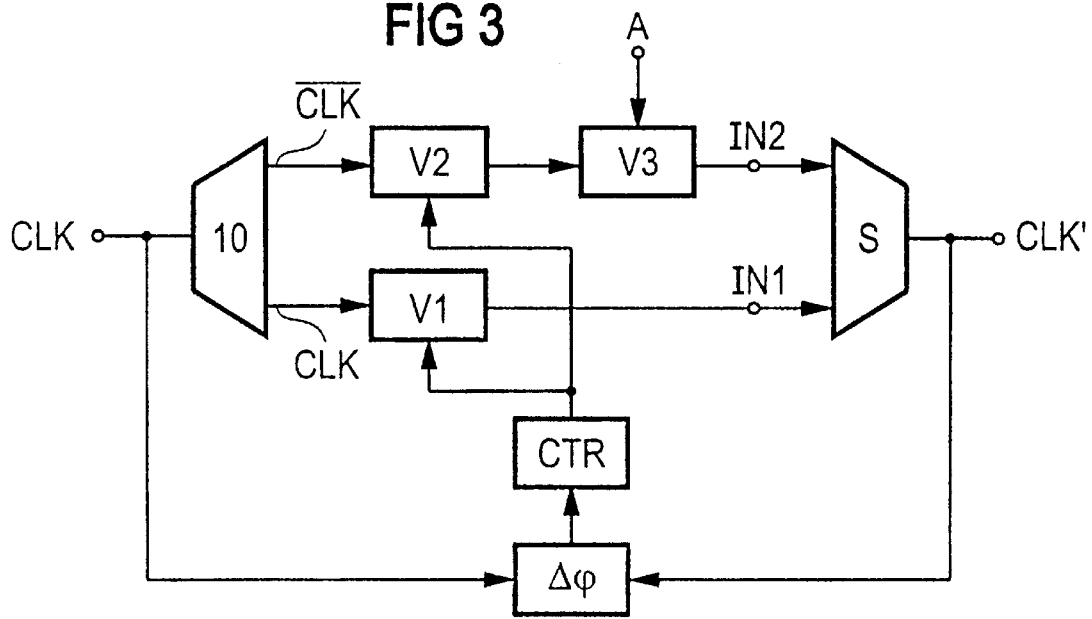
FIG. 3 is a block circuit diagram of a third exemplary embodiment of the integrated circuit.

FIG. 3 shows a third exemplary embodiment of the invention, which differs from that of FIG. 1 only in terms of the following points:

An input circuit 10 serves for generating the second clock signal $\overline{\text{CLK}}$ from the first clock signal CLK. The first clock signal CLK is fed to an input of the input circuit 10. The first clock signal is also fed directly to the first input of the phase detector. The input circuit generates the second clock signal $\overline{\text{CLK}}$ by inverting the first clock signal CLK and delays the first clock signal in such a way that, at its outputs, the two clock signals have a phase shift of exactly 180° with respect to one another. The input circuit 10 will be discussed further below with reference to FIG. 4.

The circuit unit S in FIG. 3 is disposed between the output of the first delay unit V1 and the second input of the phase detector Δϕ. The circuit unit S generates an output clock signal CLK', having edges which are derived from edges of the signals at its inputs IN1, IN2 in a manner that is explained further below with reference to FIG. 5.

Figure 4:
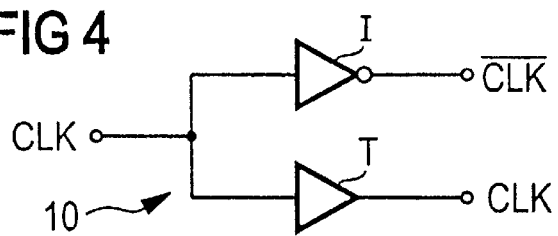

FIG. 4 shows an exemplary embodiment of the input circuit 10 of FIG. 3, with which two mutually inverse clock signals are generated. The input circuit 10 has an inverting driver or inverter I and a (non-inverting) driver T, which each have the same switching time. The non-inverted first clock signal CLK is fed to inputs of the elements I and T. The inverter I has an output supplying the second clock signal $\overline{\text{CLK}}$, which is inverted relative to the first clock signal CLK. The driver T has an output supplying the non-inverted first clock signal CLK in a delayed manner. Since the switching times of the inverter I and of the driver T correspond, the first and second clock signals are phase-shifted exactly by 180° with respect to one another.

Figure 5:
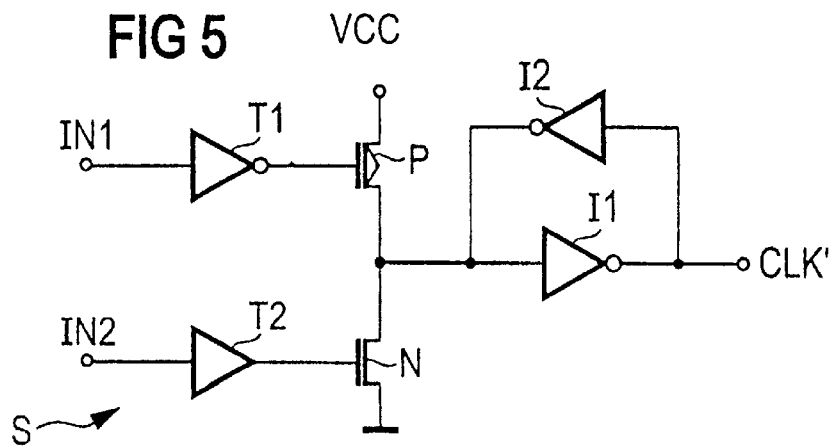
FIG. 5 is a schematic circuit diagram of an exemplary embodiment of a circuit unit of FIG. 3.

FIG. 5 discloses an exemplary embodiment of the circuit unit S of FIG. 3. A series circuit formed by a p-channel transistor P and an n-channel transistor N is disposed between a positive supply potential VCC and ground. The first input IN1 of the circuit unit S is connected through an inverting driver T1 to a gate of the p-channel transistor P. The second input IN2 of the circuit unit S is connected through a non-inverting driver T2 to a gate of the n-channel transistor N. Drains of the two transistors P, N are connected to an input of a first inverter I1, which generates the output clock signal CLK' at its output. The output of the first inverter I1 is connected through a second inverter I2 to the input of the first inverter I1. The two inverters I1, I2 form a holding circuit.

The circuit unit S shown in FIG. 5 generates the output clock signal CLK' with positive edges, which are phase-locked with respect to the positive edges of the signal at the first input IN1, and with negative edges, which are phase-locked with respect to the positive edges of the signal at the second input IN2.

The phase detector Δϕ in FIG. 3 detects the phase deviation between the positive edge of the first clock signal CLK and the positive edge of the output clock signal CLK' of the circuit unit S. The control unit regulates this phase difference to zero with the first delay unit V1. It is possible to influence the phase angle of the signal at the second input IN2 with respect to the phase angle of the signal at the first input IN1 by setting the delay time of the third delay unit V3. Since the signal at the second input IN2 influences the phase angle of the negative edges of the output clock signal CLK' and the signal at the first input IN1 influences that of its positive edges, the position of the negative edges of the output clock signal CLK' with respect to its positive edges can advantageously be set through the third delay unit.

I claim:

1. An integrated circuit, comprising:
   a first delay unit having an adjustable delay time, an input for feeding in a first clock signal and an output;
   a second delay unit having an adjustable delay time, an input for feeding in a second clock signal and an output;
   a phase detector having a first input connected to said input of said first delay unit and a second input connected to said output of said first delay unit;
   a control unit controlling the delay time of said first delay unit for correcting a phase difference ascertained by said phase detector and setting the delay time of said second delay unit to substantially the same value as that of said first delay unit;
   a circuit unit having a first input connected to said output of said first delay unit and a second input connected to said output of the second delay unit; and
   a third delay unit having an adjustable delay time, said third delay unit connected between said output of said second delay unit and said second input of said circuit unit.

2. The integrated circuit according to claim 1, wherein the second clock signal is the inverse of the first clock signal.

3. The integrated circuit according to claim 1, including a fourth delay unit having an adjustable delay time, said fourth delay unit connected between said output of said first delay unit and both said second input of said phase detector and said first input of said circuit unit.

4. The integrated circuit according to claim 1, including another delay unit having an adjustable delay time, said other delay unit connected between said second input of said phase detector and both said output of said first delay unit and said first input of said circuit unit.

5. The integrated circuit according to claim 1, including a further delay unit having an adjustable delay time, said further delay unit connected between said input of said first delay unit and said first input of said phase detector.

6. The integrated circuit according to claim 2, wherein signals with positive edges are present at said first and second inputs of said circuit unit, and said circuit unit has an output supplying an output clock signal having one edge type phase-locked with respect to the positive edges of the signal at said first input of said circuit unit and a second edge type phase-locked with respect to the positive edges of the signal at said second input of said circuit unit.

7. The integrated circuit according to claim 6, wherein said circuit unit is connected between said output of said first delay unit and said second input of said phase detector.

* * * * *